(12) United States Patent
Amari

(10) Patent No.: US 10,707,313 B2
(45) Date of Patent: Jul. 7, 2020

(54) THIN FILM TRANSISTOR, METHOD OF MANUFACTURING THIN FILM TRANSISTOR, AND DISPLAY

(71) Applicant: SONY CORPORATION, Tokyo (JP)

(72) Inventor: Koichi Amari, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/512,163

(22) PCT Filed: Sep. 10, 2015

(86) PCT No.: PCT/JP2015/075703
§ 371 (c)(1),
(2) Date: Mar. 17, 2017

(87) PCT Pub. No.: WO2016/052127
PCT Pub. Date: Apr. 7, 2016

(65) Prior Publication Data
US 2017/0288029 A1    Oct. 5, 2017

(30) Foreign Application Priority Data
Oct. 3, 2014   (JP) .................................. 2014-204636

(51) Int. Cl.
*H01L 29/417*   (2006.01)
*H01L 27/12*   (2006.01)
(Continued)

(52) U.S. Cl.
CPC ...... *H01L 29/41733* (2013.01); *H01L 27/124* (2013.01); *H01L 27/1225* (2013.01);
(Continued)

(58) Field of Classification Search
CPC ....................................................... H01L 27/12
(Continued)

(56) References Cited

U.S. PATENT DOCUMENTS

| 2006/0145148 A1* | 7/2006 | Hirai ................... H01L 51/0015 |
| | | 257/40 |
| 2012/0108018 A1* | 5/2012 | Okabe ................. H01L 27/1225 |
| | | 438/158 |

(Continued)

FOREIGN PATENT DOCUMENTS

| JP | 08-236775 A | 9/1996 |
| JP | 09-186334 A | 7/1997 |

(Continued)

*Primary Examiner* — Sheng-Bai Zhu
(74) *Attorney, Agent, or Firm* — Chip Law Group

(57) ABSTRACT

A thin film transistor includes a gate electrode, an insulation film disposed on the gate electrode, a semiconductor layer facing the gate electrode with the insulation film in between, and a source-drain wiring layer electrically coupled to the semiconductor layer, and including a first wiring layer and a second wiring layer. The first wiring layer is in contact with the semiconductor layer between the semiconductor layer and the insulation film, and is configured of a transparent electroconductive film. The second wiring layer is overlapped with a portion of the first wiring layer. Another semiconductor layer made of a material same as a material of the semiconductor layer is stacked on the second wiring layer.

9 Claims, 17 Drawing Sheets

(51) Int. Cl.
*H01L 27/28* (2006.01)
*H01L 29/66* (2006.01)
*H01L 29/786* (2006.01)
*H01L 51/05* (2006.01)

(52) U.S. Cl.
CPC ...... *H01L 27/283* (2013.01); *H01L 29/66969* (2013.01); *H01L 29/7869* (2013.01); *H01L 51/0545* (2013.01)

(58) Field of Classification Search
USPC ........................................ 257/59, 72; 438/34
See application file for complete search history.

(56) References Cited

U.S. PATENT DOCUMENTS

2012/0273780 A1* 11/2012 Yamazaki ........... H01L 27/1225
257/43
2014/0070219 A1* 3/2014 Shen ....................... H01L 21/77
257/59

FOREIGN PATENT DOCUMENTS

| JP | 2011-044575 A | 3/2011 |
| JP | 2012-190978 A | 4/2012 |
| JP | 2013-138196 A | 7/2013 |

* cited by examiner

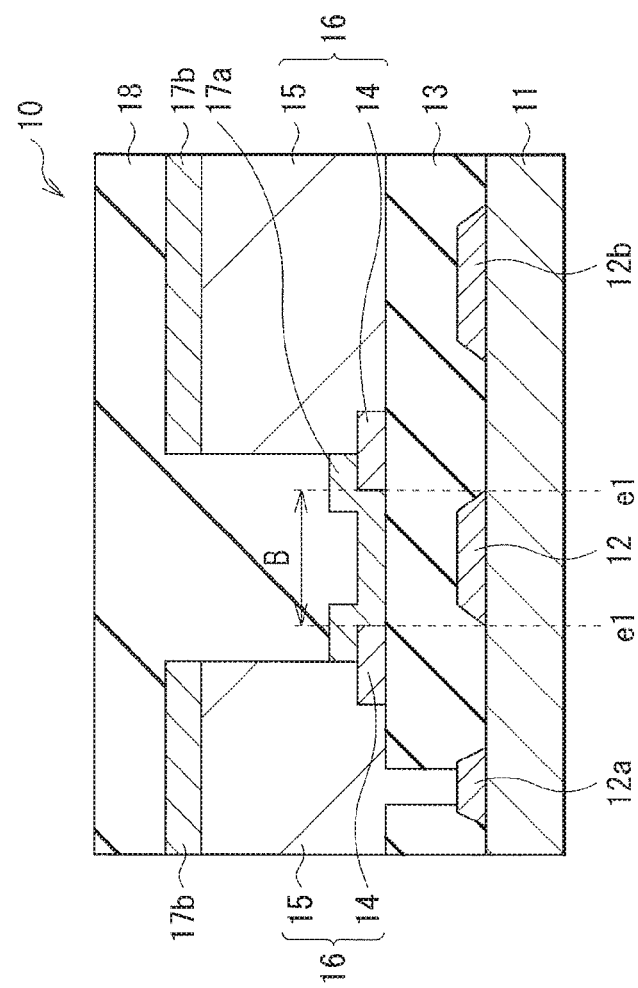

[ FIG. 2A ]
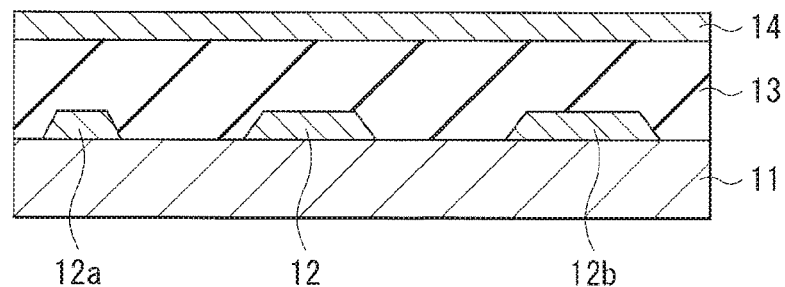
[ FIG. 2B ]
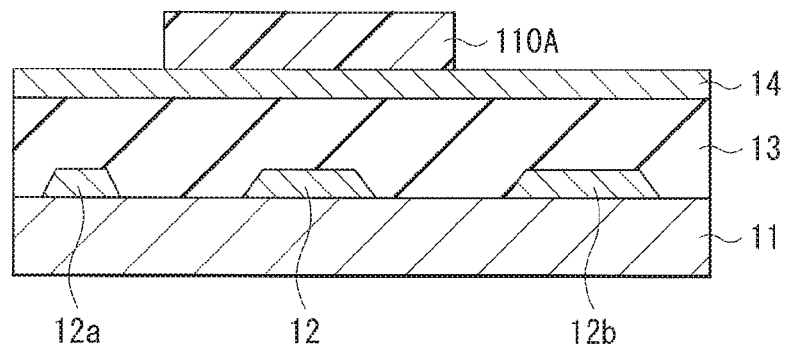
[ FIG. 2C ]
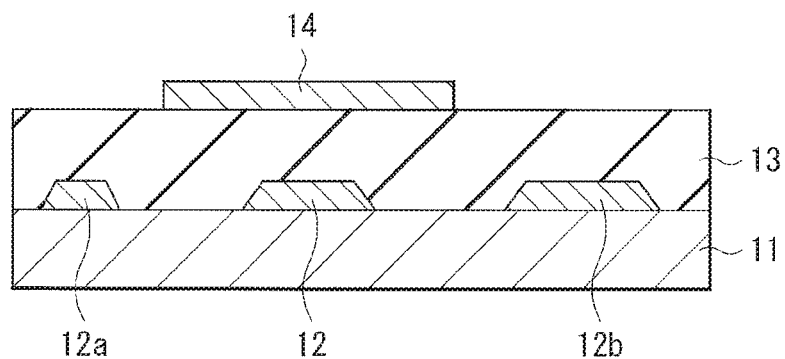

[ FIG. 3A ]
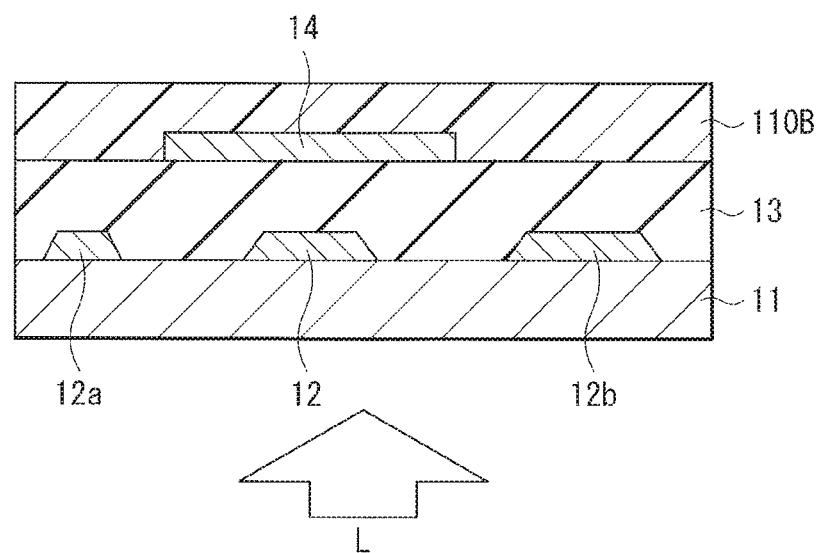
[ FIG. 3B ]
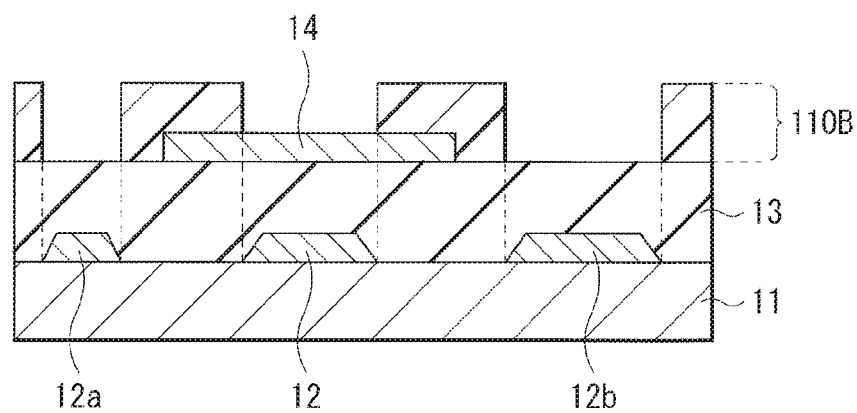

[ FIG. 3C ]
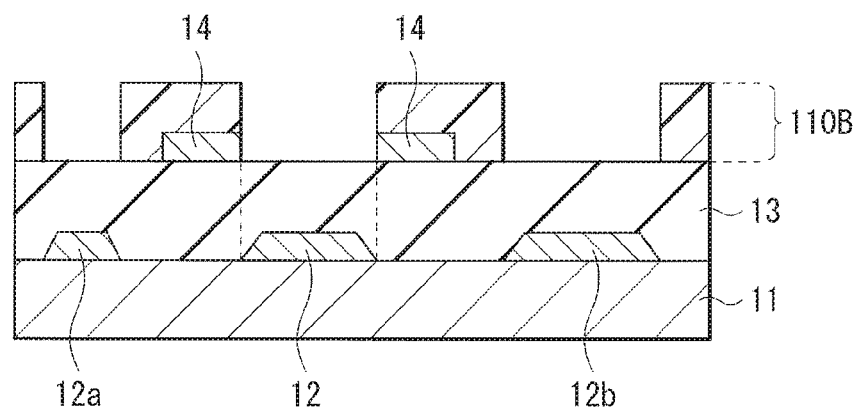
[ FIG. 3D ]
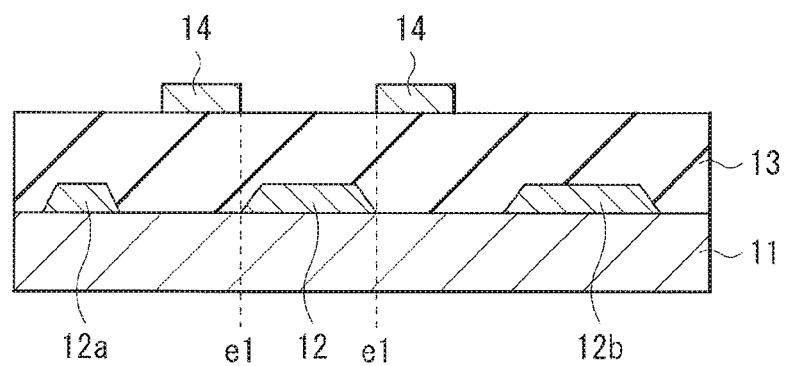

[ FIG. 4A ]
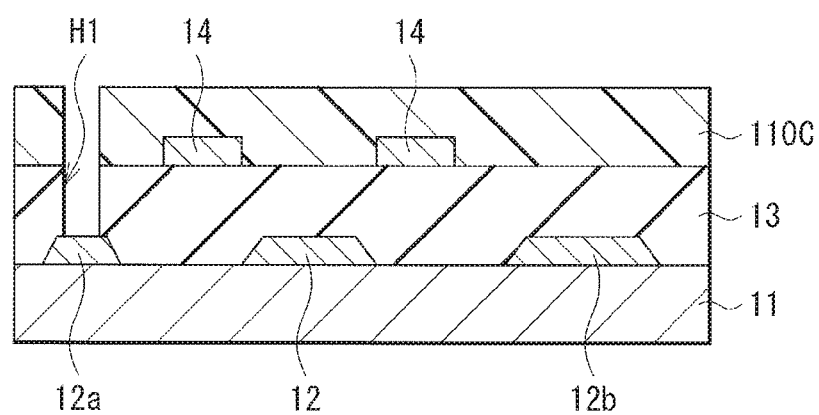
[ FIG. 4B ]
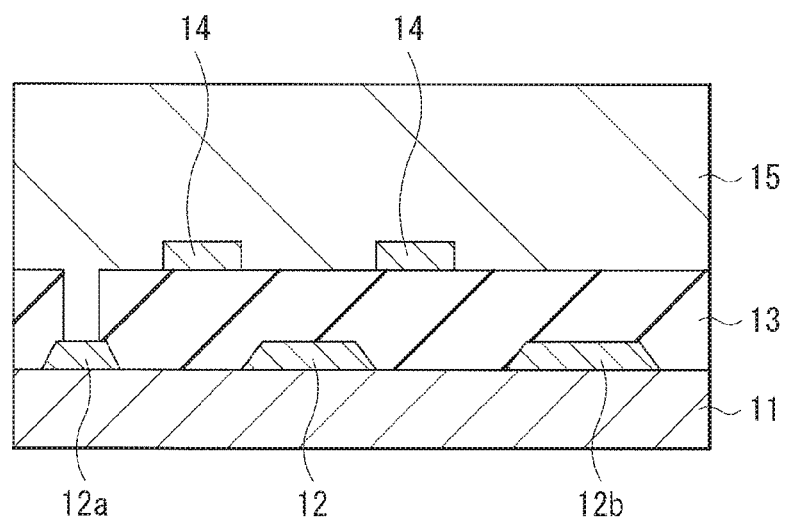

[ FIG. 4C ]
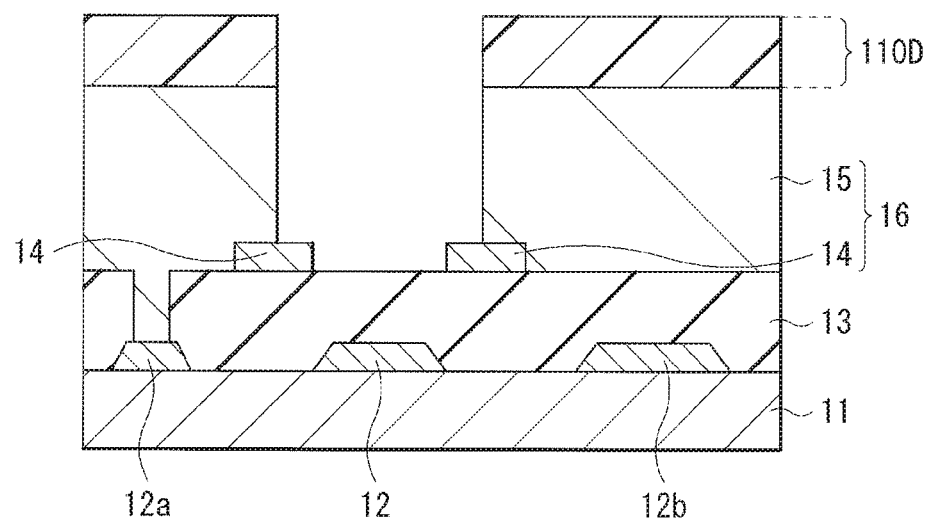
[ FIG. 4D ]
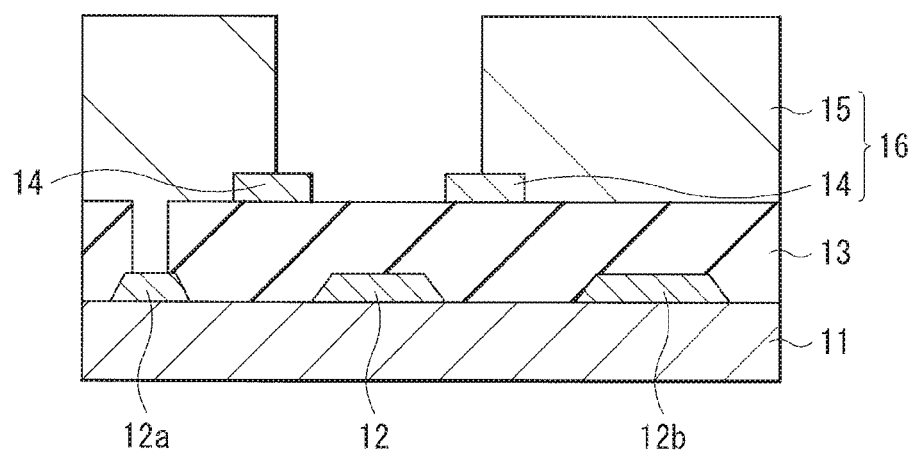

[ FIG. 5A ]
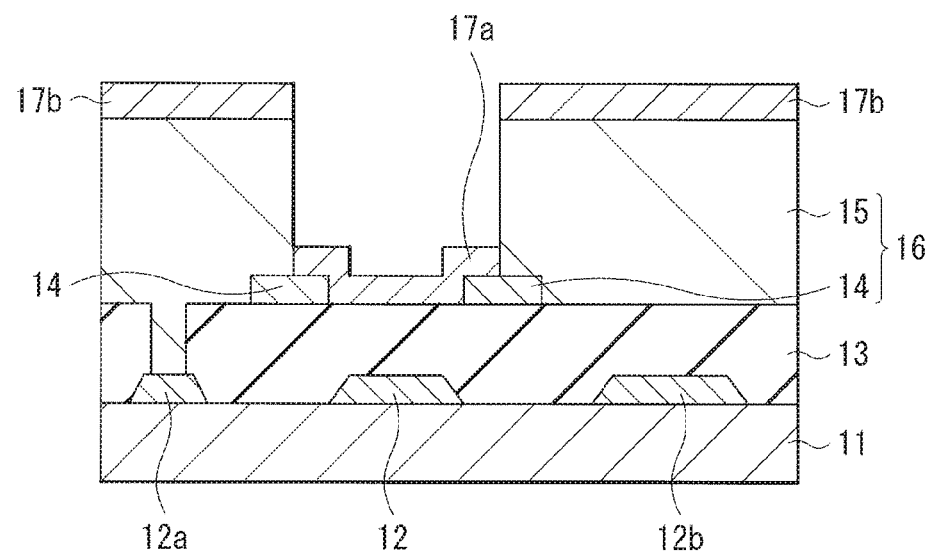
[ FIG. 5B ]
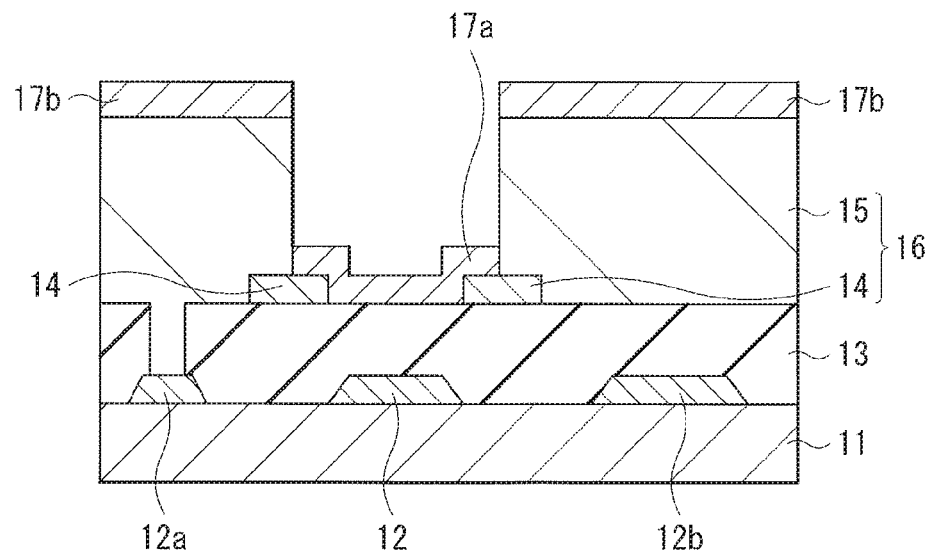

[ FIG. 6 ]
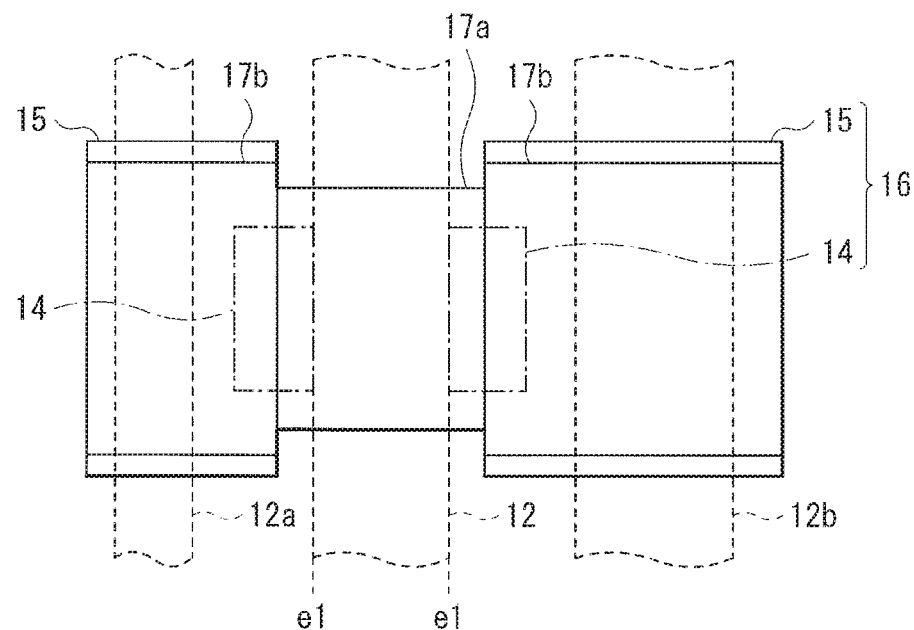
[ FIG. 7 ]
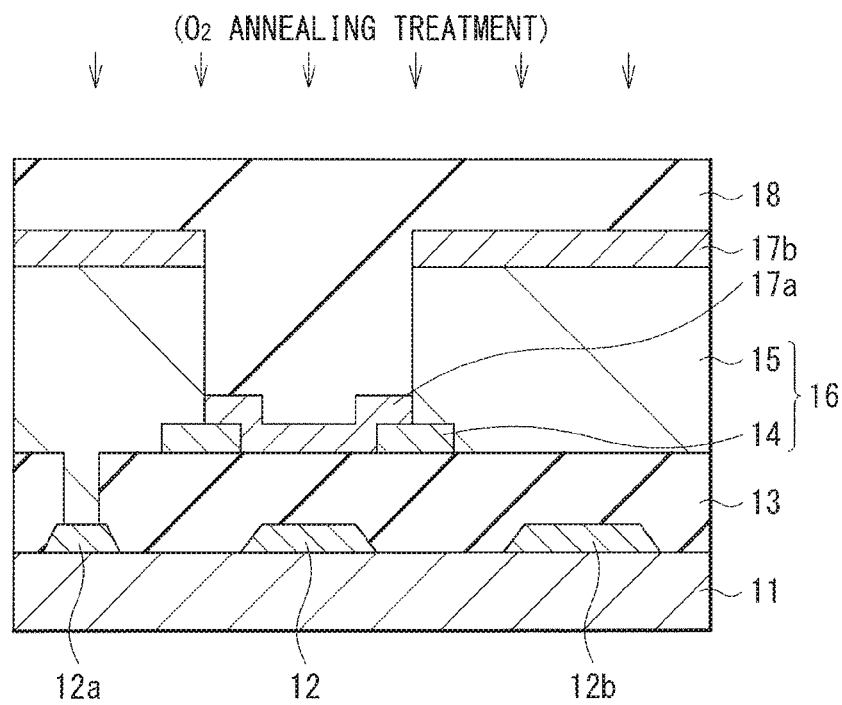

[ FIG. 8 ]
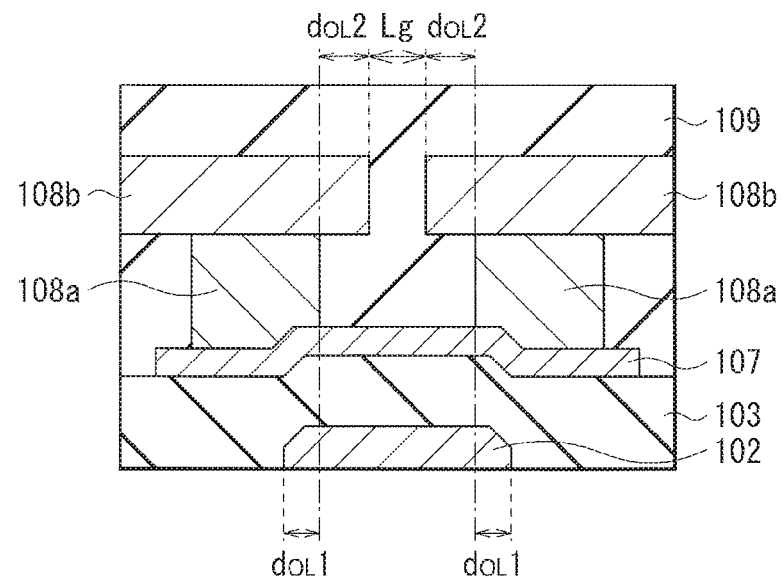
[ FIG. 9 ]
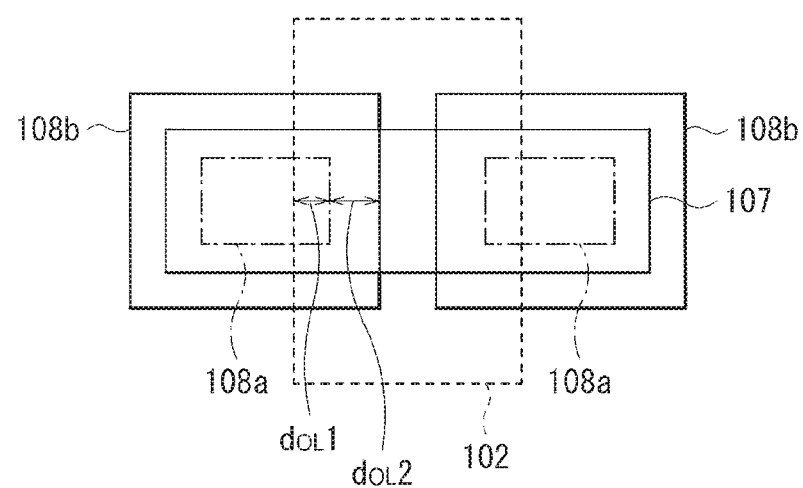

[ FIG. 10A ]
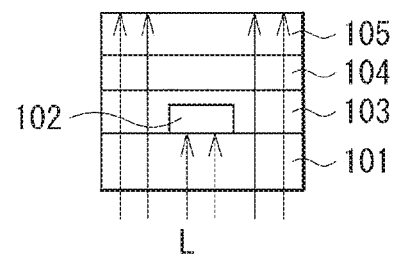
[ FIG. 10B ]
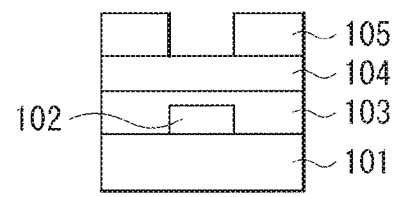
[ FIG. 10C ]
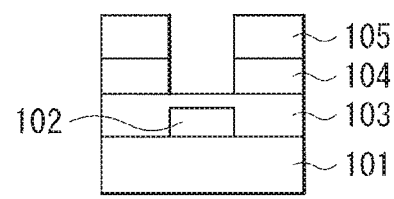
[ FIG. 10D ]
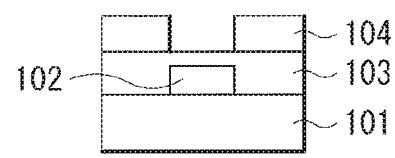
[ FIG. 10E ]
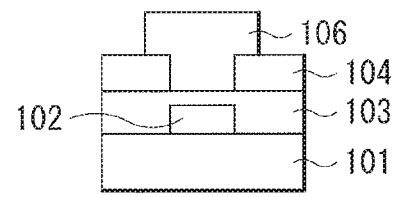

[ FIG. 11 ]
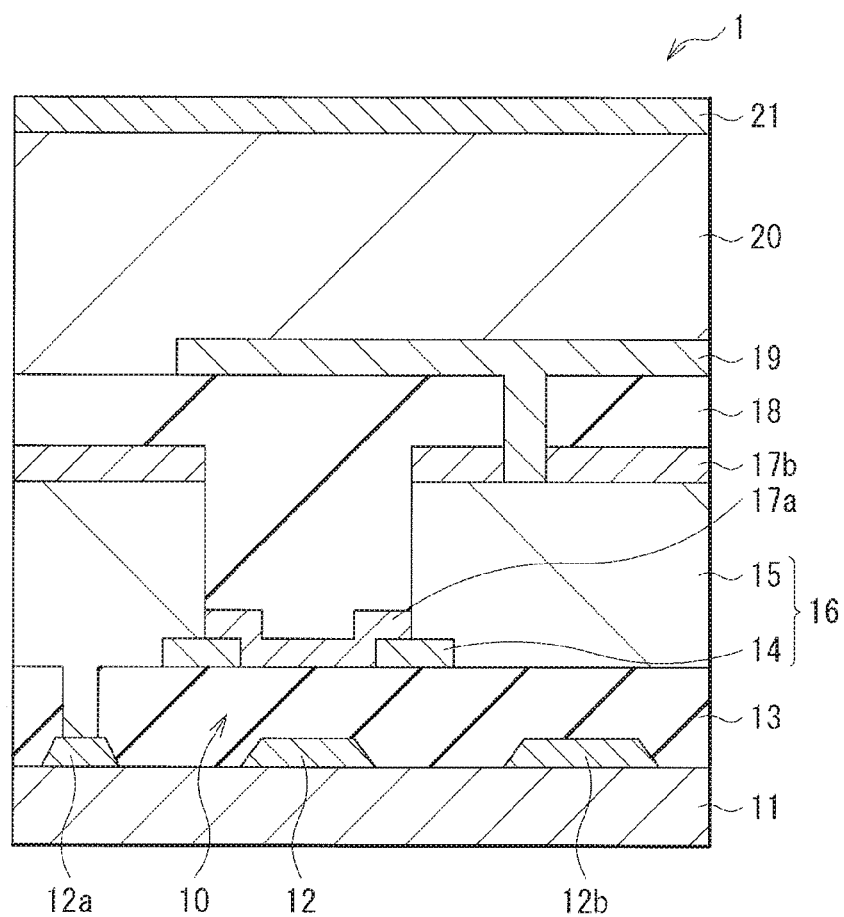

[ FIG. 12 ]
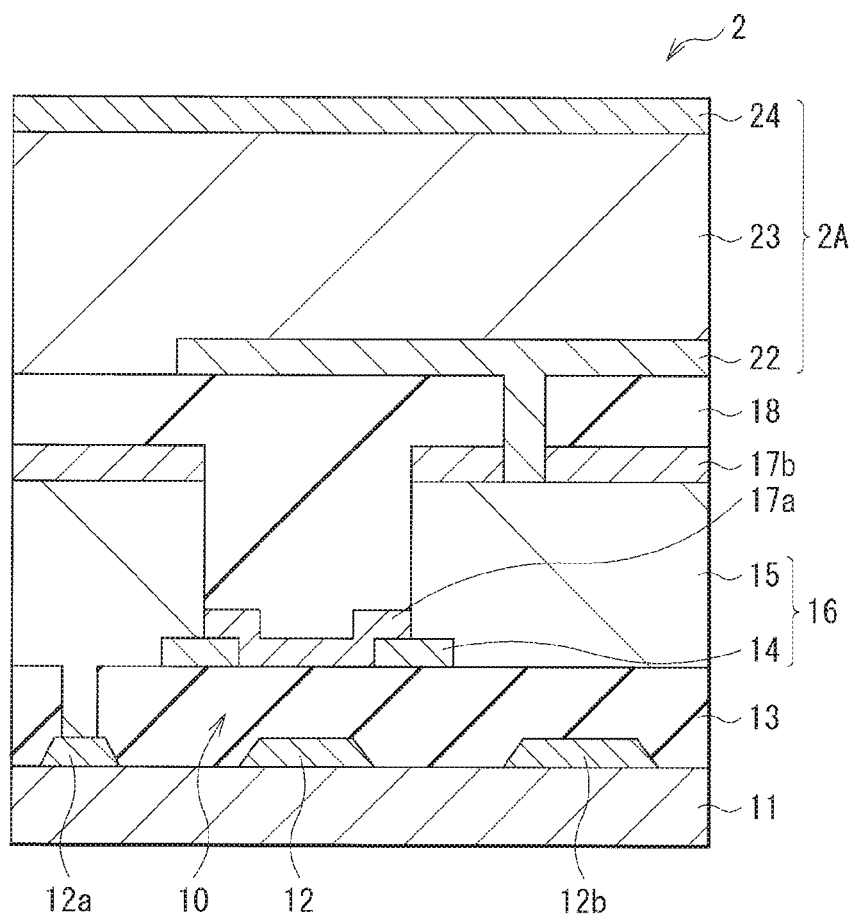

[ FIG. 13 ]
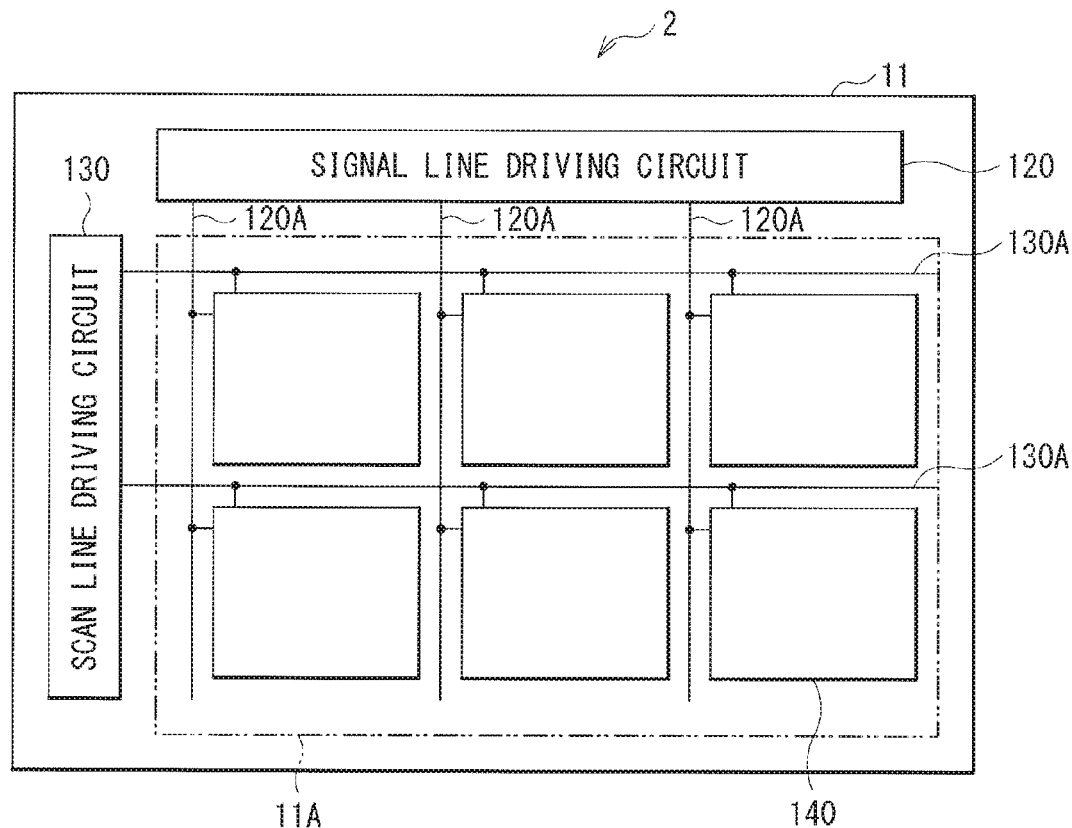
[ FIG. 14 ]
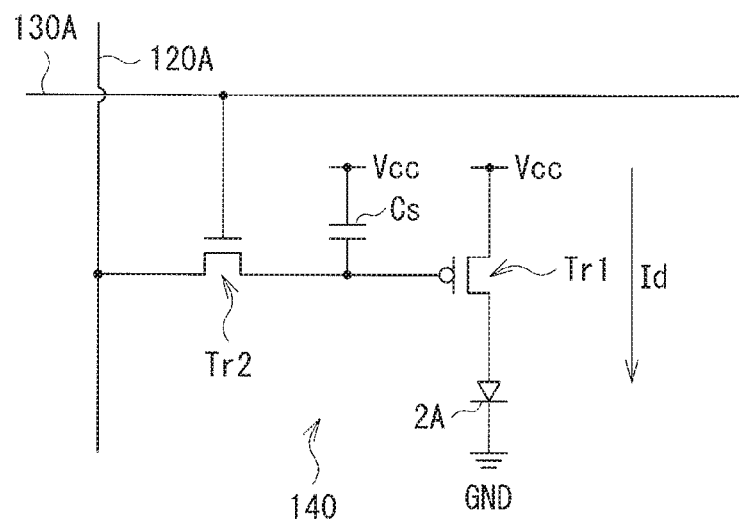

[ FIG. 15A ]
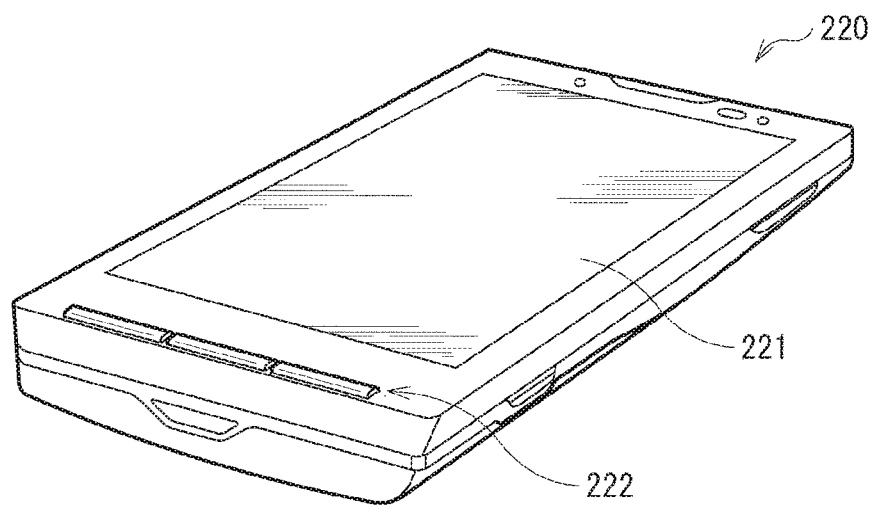
[ FIG. 15B ]
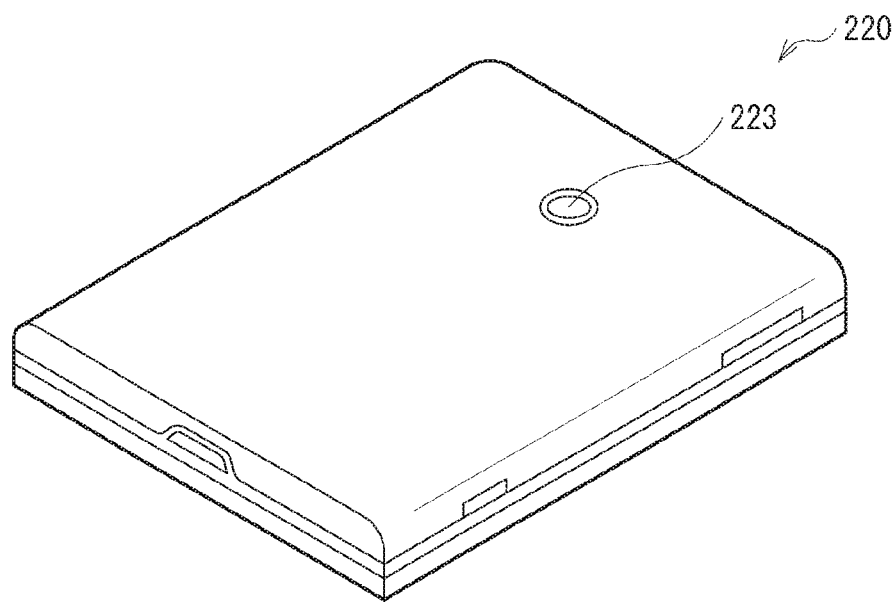

[ FIG. 16 ]
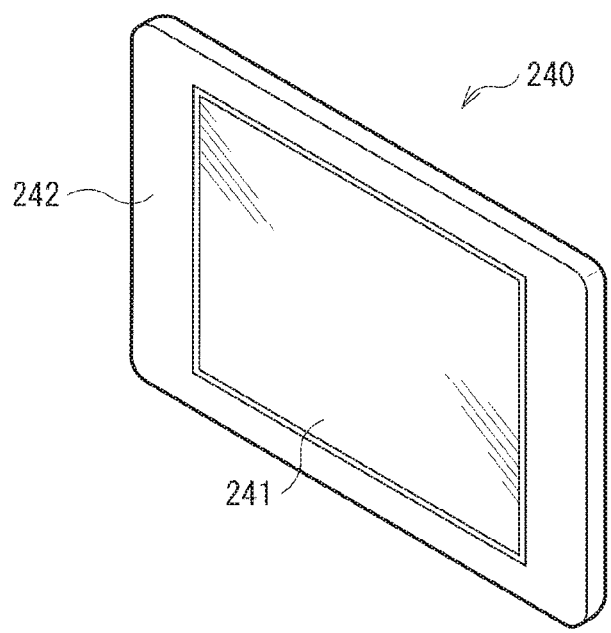

[ FIG. 17A ]
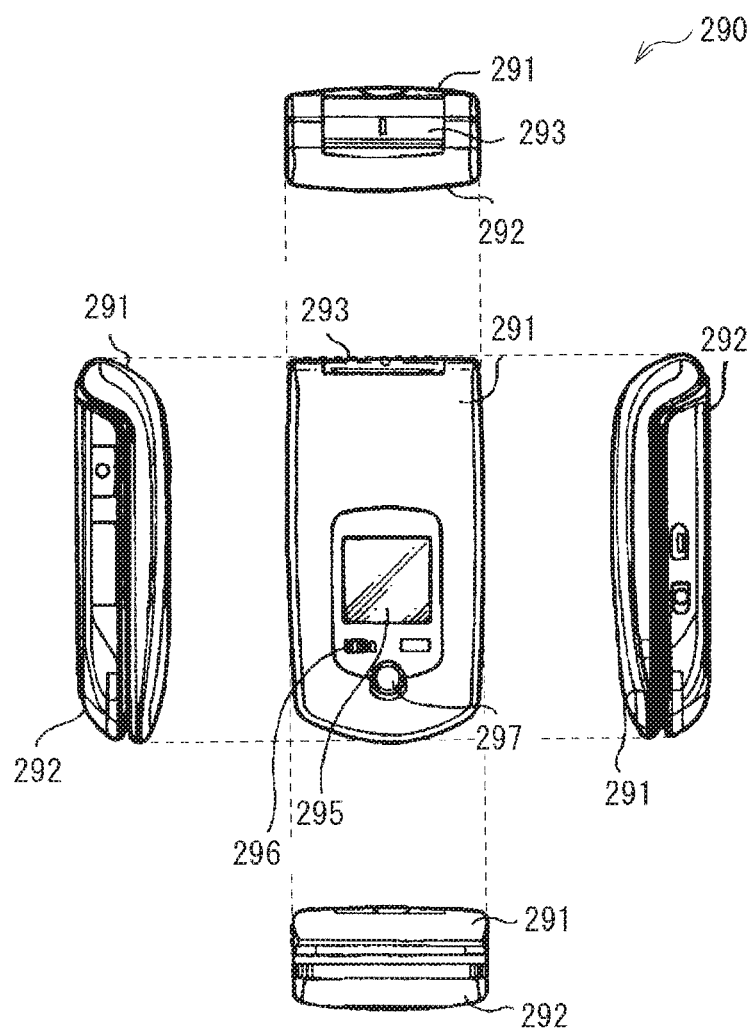

[ FIG. 17B ]
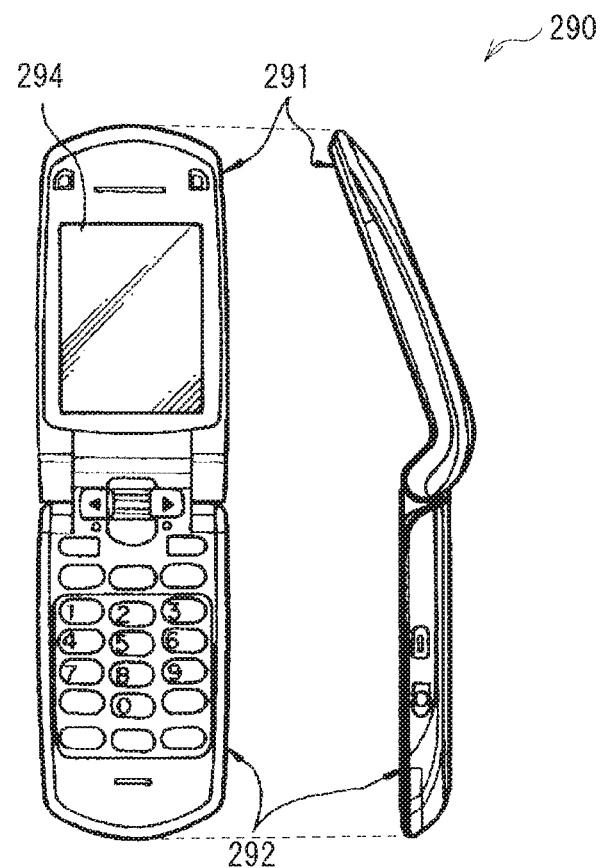
[ FIG. 18 ]
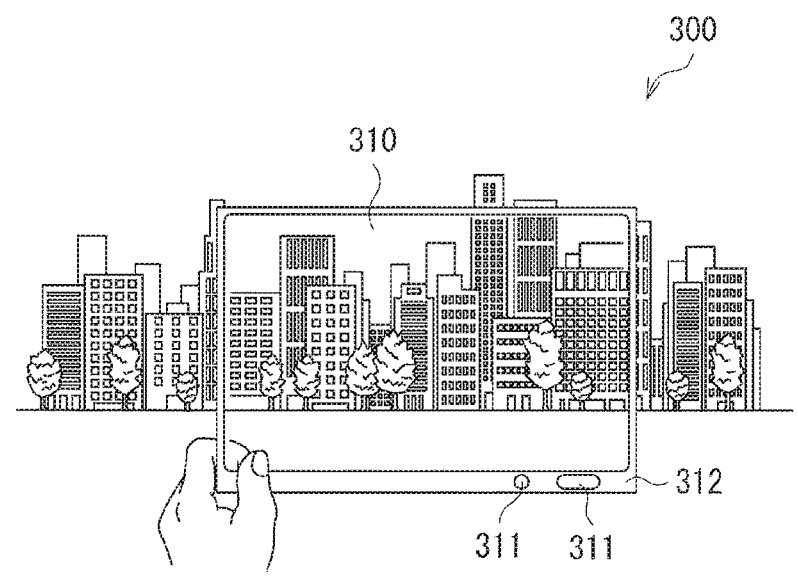

THIN FILM TRANSISTOR, METHOD OF MANUFACTURING THIN FILM TRANSISTOR, AND DISPLAY

CROSS REFERENCE TO RELATED APPLICATIONS

This application is a U.S. National Phase of International Patent Application No. PCT/JP2015/075703 filed on Sep. 10, 2015, which claims priority benefit of Japanese Patent Application No. JP 2014-204636 filed in the Japan Patent Office on Oct. 3, 2014. Each of the above-referenced applications is hereby incorporated herein by reference in its entirety.

TECHNICAL FIELD

The disclosure relates to a thin film transistor used in a display, a method of manufacturing the thin film transistor, and the display.

BACKGROUND ART

There are a wide variety of structures of a thin film transistor using an oxide semiconductor, for example, a structure of a bottom-gate bottom-contact type (PTL 1) or a bottom-gate top-contact type (PTL 2). In the bottom-gate bottom-contact structure (hereinafter, simply referred to as a bottom-contact structure), a source-drain wiring line (a contact portion with a channel) may be formed through photolithography including a self-alignment process. More specifically, the source-drain wiring line may be formed through a backside exposure process using a gate electrode (a gate wiring line) as a mask. A transparent electroconductive film is used for the source-drain wiring line.

The bottom-contact structure has the following advantages, as compared with the bottom-gate top-contact structure (hereinafter, simply referred to as the top-contact structure). In other words, unlike the top-contact structure, the source-drain wiring line is formed before formation of a semiconductor layer including the channel in the bottom-contact structure. This causes less etching damages to the channel region. Therefore, it is possible to suppress a decrease in reliability and to prevent an increase in variation of the transistor characteristics.

CITATION LIST

Patent Literature

PTL 1: Japanese Unexamined Patent Application Publication No. 2011-44575
PTL 2: Japanese Unexamined Patent Application Publication No. 2012-190978

SUMMARY OF INVENTION

In the bottom-contact thin film transistor as disclosed in foregoing PTL 1, however, the semiconductor layer is patterned on the source-drain wiring line. Therefore, etching having selectivity is demanded between the oxide semiconductor layer and the source-drain wiring line configured of, for example, a transparent electroconductive film. This is a difficult process and is low in realization. In addition, when the transparent electroconductive film is used for the wiring layer, the drive current is disadvantageously increased in the display due to high electric resistance of the transparent electroconductive film.

Accordingly, it is desirable to provide a thin film transistor that makes it possible to make a manufacturing process easy and to achieve low voltage driving in a bottom-gate bottom-contact device structure, a method of manufacturing the thin film transistor, and a display.

A thin film transistor according to an embodiment of the disclosure includes: a gate electrode; an insulation film disposed on the gate electrode; a semiconductor layer facing the gate electrode with the insulation film in between; and a source-drain wiring layer electrically coupled to the semiconductor layer, and including a first wiring layer and a second wiring layer. The first wiring layer is in contact with the semiconductor layer between the semiconductor layer and the insulation film and is configured of a transparent electroconductive film. The second wiring layer is overlapped with a portion of the first wiring layer. Another semiconductor layer made of a material same as a material of the semiconductor layer is stacked on the second wiring layer.

A method of manufacturing a thin film transistor according to an embodiment of the disclosure includes: forming a gate electrode; forming an insulation film on the gate electrode; forming a semiconductor layer that faces the gate electrode with the insulation film in between; forming a source-drain wiring layer that is electrically coupled to the semiconductor layer, in which a first wiring layer and a second wiring layer are formed in this order as the source-drain wiring layer, the first wiring layer is made of a transparent electroconductive film, and the second wiring layer is overlapped with a portion of the first wiring layer; and forming the semiconductor layer after the forming of the second wiring layer.

In the thin film transistor and the method of manufacturing the thin film transistor according to the respective embodiments of the disclosure, the source-drain wiring layer includes the first wiring layer that is configured of the transparent electroconductive film and the second wiring layer that is overlapped with the portion of the first wiring layer. Overlapping of the second wiring layer with the first wiring layer reduces the electric resistance of the source-drain wiring layer, as compared with a case in which the source-drain layer has a single layer structure of only the first wiring layer. In addition, in the manufacturing process, the semiconductor layer is formed after the formation of the second wiring layer, which allows the first wiring layer to be covered with the second wiring layer and the semiconductor layer. Although it is technically difficult to perform etching having selectivity of the semiconductor layer on the first wiring layer, it is possible to form the semiconductor layer without performing such selective etching.

A display according to an embodiment of the disclosure includes the above-described thin film transistor according to the embodiment of the disclosure.

In the thin film transistor, the method of manufacturing the thin film transistor, and the display according to the respective embodiments of the disclosure, the source-drain wiring layer includes the first wiring layer and the second wiring layer. The first wiring layer is in contact with the semiconductor layer between the semiconductor layer and the insulation film and is configured of the transparent electroconductive film. The second wiring layer is overlapped with the portion of the first wiring layer. Overlapping of the second wiring layer with the first wiring layer makes it possible to reduce the resistance of the source-drain wiring layer and to reduce the drive voltage as compared with a case in which the source-drain wiring layer has a single layer structure of only the first wiring layer. In addition, in the manufacturing process, forming the semiconductor layer after the formation of the second wiring layer makes it possible to form the semiconductor layer in the desired region without performing etching of the semiconductor layer on the first wiring layer. Consequently, it is possible to make the manufacturing process easy and to achieve low voltage driving.

Note that the above-described contents are examples of the disclosure. Effects achieved by the disclosure are not limited to those described above, and may be effects other than those described above or may further include other effects.

BRIEF DESCRIPTION OF DRAWINGS

FIG. 1 is a cross-sectional diagram illustrating a schematic configuration of a thin film transistor according to an embodiment of the disclosure.

FIG. 2A is a cross-sectional diagram to explain a method of manufacturing a display illustrated in FIG. 1.

FIG. 2B is a cross-sectional diagram illustrating a process following the process of FIG. 2A.

FIG. 2C is a cross-sectional diagram illustrating a process following the process of FIG. 2B.

FIG. 3A is a cross-sectional diagram illustrating a process following the process of FIG. 2C.

FIG. 3B is a cross-sectional diagram illustrating a process following the process of FIG. 3A.

FIG. 3C is a cross-sectional diagram illustrating a process following the process of FIG. 3B.

FIG. 3D is a cross-sectional diagram illustrating a process following the process of FIG. 3C.

FIG. 4A is a cross-sectional diagram illustrating a process following the process of FIG. 3D.

FIG. 4B is a cross-sectional diagram illustrating a process following the process of FIG. 4A.

FIG. 4C is a cross-sectional diagram illustrating a process following the process of FIG. 4B.

FIG. 4D is a cross-sectional diagram illustrating a process following the process of FIG. 4C.

FIG. 5A is a cross-sectional diagram illustrating a process following the process of FIG. 4D.

FIG. 5B is a cross-sectional diagram illustrating a process following the process of FIG. 5A.

FIG. 6 is a plan view of a layout of a portion of components of FIG. 5B.

FIG. 7 is a cross-sectional diagram illustrating a process following the process of FIG. 5B.

FIG. 8 is a cross-sectional diagram illustrating a schematic configuration of a thin film transistor according to a comparative example 1.

FIG. 9 is a plan view of a layout of a portion of components of FIG. 8.

FIG. 10A is a cross-sectional diagram to explain a method of manufacturing a thin film transistor according to a comparative example 2.

FIG. 10B is a cross-sectional diagram illustrating a process following the process of FIG. 10A.

FIG. 10C is a cross-sectional diagram illustrating a process following the process of FIG. 10B.

FIG. 10D is a cross-sectional diagram illustrating a process following the process of FIG. 10C.

FIG. 10E is a cross-sectional diagram illustrating a process following the process of FIG. 10D.

FIG. 11 is a cross-sectional diagram illustrating a schematic configuration of a liquid crystal display.

FIG. 12 is a cross-sectional diagram illustrating a schematic configuration of an organic electroluminescence apparatus.

FIG. 13 is a functional block diagram illustrating an entire configuration of the organic electroluminescence apparatus illustrated in FIG. 12.

FIG. 14 is a circuit diagram illustrating an example of a pixel circuit illustrated in FIG. 13.

FIG. 15A is a perspective view of a configuration of a smartphone.

FIG. 15B is a perspective view of the configuration of the smartphone.

FIG. 16 is a perspective view of a configuration of a tablet personal computer.

FIG. 17A is a plan view of a configuration of a mobile phone.

FIG. 17B is a plan view of the configuration of the mobile phone.

FIG. 18 is a perspective view of a configuration of a transparent display.

DESCRIPTION OF EMBODIMENTS

Some embodiments of the disclosure are described in detail below with reference to drawings. Note that description is given in the following order.

1. Embodiment (an example of a thin film transistor in which a first wiring layer of a source-drain wiring layer is formed through a self-alignment process and a semiconductor layer is formed after a second wiring layer is formed)

2. Application Examples (examples of an electronic apparatus)

Embodiment

[Configuration]

FIG. 1 is a diagram illustrating a configuration of a thin film transistor (a thin film transistor 10) according to an embodiment of the disclosure. The thin film transistor (TFT) 10 is used in a pixel circuit or a peripheral circuit of a display described later, and may be suitably used as, for example, an oxide TFT or an organic TFT. The thin film transistor 10 has a so-called bottom-gate bottom-contact device structure, and may include, for example, a gate electrode 12 in a selective region on a substrate 11. A gate insulation film 13 (an insulation film) is so provided as to cover the gate electrode 12. A semiconductor layer 17a including an active layer (a channel) is disposed to face the gate electrode 12 with the gate insulation film 13 in between. A source-drain wiring layer 16 is electrically coupled to the semiconductor layer 17a. The source-drain wiring layer 16 includes a first wiring layer 14 and a second wiring layer 15 that are stacked in order from the substrate 11 side. The first wiring layer 14 is in contact with the semiconductor layer 17a from below (functions as a so-called bottom contact) between the gate insulation film 13 and the semiconductor layer 17a. The second wiring layer 15 is provided to be overlapped with a portion of the first wiring layer 14. A semiconductor layer 17b (another semiconductor layer) is provided on the second wiring layer 15. The semiconductor layer 17b is made of the material same as that of the semiconductor layer 17a, and has the thickness same as that of the semiconductor layer 17a. An interlayer insulation film 18 is so provided on the semiconductor layers 17a and 17b as to cover the entire transistor.

The substrate 11 may be made of, for example, glass. The substrate 11, however, may be made of, for example, a silicon (Si) wafer, a resin, or an electroconductive substrate, besides the glass. As the electroconductive substrate, for example, a substrate having a surface subjected to insulation processing with use of silicon oxide ($SiO_2$), a resin, or other materials. Moreover, the substrate 11 may be made of a material having flexibility (flexible property). Examples of the material having flexibility may include resin materials such as polyimide (PI), polyethylene terephthalate (PET), polyether sulfone (PES), polyethylene naphthalate (PEN), polycarbonate (PC), and liquid crystal polymer. Alternatively, the material having flexibility may be a thin metal sheet having a surface subjected to the insulation processing, besides the above-described resin materials.

The gate electrode 12 serves to apply a gate voltage to the thin film transistor 10 and control an electron density in the semiconductor layer 17a with the gate voltage. The gate electrode 12 may be made of a single substance of any of metals such as aluminum (Al), titanium (Ti), platinum (Pt), gold (Au), palladium (Pd), chromium (Cr), nickel (Ni), molybdenum (Mo), niobium (Nb), neodymium (Nd), rubidium (Rb), rhodium (Rh), silver (Ag), tantalum (Ta), tungsten (W), copper (Cu), indium (In), and tin (Sn), or an alloy containing one or more of these metals. In addition, the gate electrode 12 may be a single layer film made of the single substance or the alloy of any of the metals, or a multilayer film made of two or more stacked metals. As an example, the gate electrode 12 may be a multilayer film in which a molybdenum layer having a thickness of 50 nm and an aluminum layer having a thickness of 400 nm are stacked. Note that other wiring lines (wiring lines 12a and 12b) provided on the same layer as the gate electrode 12 are also illustrated in FIG. 1.

The gate insulation film 13 may be configured of, for example, an inorganic insulation film. Examples of the inorganic insulation film may include a single layer film made of one of silicon oxide ($SiO_2$), silicon nitride ($SiN_x$), silicon oxynitride ($SiON_x$), aluminum oxide ($Al_2O_3$), and tantalum oxide ($Ta_2O_5$), or a multilayer film in which two or more thereof are stacked. The gate insulation film 13 may have a thickness of, for example, 200 nm to 500 nm. In addition, in a case of the organic TFT, an organic insulation film is used as the gate insulation film 13. Examples of the organic insulation film may include a single layer film made of one of polyvinyl phenol (PVP), diallylphthalate, polyimide, polymethyl methacrylate, polyvinyl alcohol (PVA), polyester, polyethylene, polycarbonate, polyamide, polyamide imide, polyether imide, polysiloxane, polymethacrylamide, polyurethane, polybutadiene, polystyrene, polyvinyl chloride, nitrile rubber, acrylic rubber, butyl rubber, an epoxy resin, a phenol resin, a melamine resin, a urea resin, a novolac resin, and a fluorine-based resin, or a multilayer film made of two or more thereof.

The source-drain wiring layer 16 functions as a source or a drain. Here, the source-drain wiring layer 16 is electrically separated into two parts provided on respective two positions on the gate insulation film 13, and one part of the source-drain wiring layer 16 functions as the source and the other part functions as the drain.

The first wiring layer 14 is so formed that at least a portion of the first wiring layer 14 is partially sandwiched between the gate insulation film 13 and the semiconductor layer 17a, and is in contact with the semiconductor layer 17a from below (forms the bottom contact). In other words, a portion of the first wiring layer 14 is covered with the semiconductor layer 17a on the gate insulation film 13. A portion of the first wiring layer 14 exposed from the semiconductor layer 17a is covered with the second wiring layer 15 (the first wiring layer 14 is covered with the semiconductor layer 17a and the second wiring layer 15). The first wiring layer 14 is formed with use of a self-alignment process described later. More specifically, a photoresist is patterned through a backside exposure using the gate electrode 12 as a mask in an exposure process of photolithography upon patterning of the first wiring layer 14. Using such a process causes an end part of the first wiring layer 14 not to be overlapped with an end part of the gate electrode 12 in a plan view. Further, a distance (a distance B) between the two first wiring layers 14 is substantially equal to a width of the gate electrode 12. In other words, the end part of the first wiring layer 14 is disposed at a position (a position e1 illustrated in FIG. 1) substantially same as a position of the end part of the gate electrode 12 in a plan view. The distance B is equivalent to a channel length.

The first wiring layer 14 may be configured of a transparent electroconductive film that is made of, for example, indium tin oxide (ITO), indium zinc oxide (IZO), indium gallium zinc oxide (IGZO), indium tin zinc oxide (ITZO), zinc oxide (ZnO), indium gallium oxide (IGO), or indium oxide (InO). The first wiring layer 14 may have a thickness of, for example, 10 nm to 50 nm.

The second wiring layer 15 may be desirably configured of an electroconductive film having electroconductivity higher than that of the first wiring layer 14, for example, a metal. Examples of the metal forming the second wiring layer 15 may include a single substance of aluminum (Al) or silver (Ag), or an alloy containing aluminum or silver as a main component. The constituent material of the second wiring layer 15, however, is not limited to the metal, and the second wiring layer 15 may be configured of a transparent electroconductive film that is used as the first wiring layer 14. This is because resistance of the source-drain wiring layer 16 is reduced as compared with a case in which the source-drain wiring layer 16 is formed as a single layer film of the first wiring layer 14. To further reduce the resistance value, however, the second wiring layer 15 may be desirably made of a metal. The second wiring layer 15 may have a thickness of, for example, 1 μm to 2 μm that is larger than the thickness of the semiconductor layer 17a. The second wiring layer 15 may desirably have the thickness sufficient to disconnect the semiconductor layer 17 at an end part (a side surface) of the second wiring layer 15 (the semiconductor layer 17 is divided by the end part). The second wiring layer 15 is provided to be overlapped with respective portions of the two first wiring layers 14 on the gate insulation film 13. The second wiring layer 15 is not overlapped with the semiconductor layer 17a.

The semiconductor layer 17a forms a channel in a region between the source and the drain in response to application of the gate voltage. The semiconductor layer 17a may be configured of, for example, an oxide semiconductor. The oxide semiconductor may be a compound containing one or more of elements such as indium (In), gallium (Ga), zinc (Zn), and tin (Sn), and oxygen. More specifically, examples of the compound may include indium gallium zinc oxide (IGZO), indium tin zinc oxide (ITZO), zinc oxide (ZnO), indium zinc oxide (IZO), indium gallium oxide (IGO), indium tin oxide (ITO), and indium oxide (InO). In addition, in the case of the organic TFT, an organic semiconductor is used for the semiconductor layer 17a. The organic semiconductor is one or more kinds of organic materials doped with one or more kinds of doping materials. The one or more kinds of organic materials may be selected from a group of polythiophene, polypyrrole, polyaniline, polyacetylene, polyphenylene, polyfuran, polyselenophene, polyisothianaphthene, polyphenylene sulfide, polyphenylene vinylene, poly(thienylnene vinylene), polynaphthalene, polyanthracene, polypyrene, polyazulene, phthalocyanine, pentacene, merocyanine, and polyethylenedioxythiophene. The one or more kinds of doping materials may be selected from a group of iodine, perchloric acid, hydrochloric acid, sulfuric acid, nitric acid, phosphoric acid, tetrafluoro boric acid, arsenic pentafluoride, hexafluoro phosphoric acid, alkyl sulfonic acid, perfluoro alkyl sulfonic acid, polyacrylic acid, polystyrene sulfonic acid, and dodecylbenzensulfonic acid. The semiconductor layer 17a may have a thickness of, for example, about 10 nm to about 50 nm.

Although the detail is described later, the semiconductor layer 17a is formed after the formation of the second wiring layer 15 of the source-drain wiring layer 16, and is accordingly partially patterned owing to the disconnection at the end part of the second wiring layer 15. The semiconductor layer 17a is provided in a region that covers a portion (the end part and a portion of the top surface) of the first wiring layer 14 and that is sandwiched by the second wiring layers 15. Moreover, the semiconductor layer 17b is also provided on a portion of the second wiring layer 15. The semiconductor layer 17b is made of the material same as that of the semiconductor layer 17a, and has the thickness same as that of the semiconductor layer 17a. The semiconductor layer 17b results from a semiconductor material that is separated from the semiconductor layer 17a and is deposited on the second wiring layer 15 in formation of the semiconductor layer 17a.

The interlayer insulation film 18 may be configured of an inorganic insulation film that is made of, for example, silicon oxide, silicon nitride, and aluminum oxide, or an organic insulation film that is made of, for example, acryl, polyimide, and siloxane.

[Manufacturing Method]

Next, a method of manufacturing the thin film transistor 10 is described. FIG. 2A to FIG. 7 are cross-sectional diagrams to explain the method of manufacturing the thin film transistor 10 in a process order.

First, the gate electrode 12 (and the wiring layers 12a and 12b) and the gate insulation film 13 are formed in this order on the substrate 11.

(Formation of First Wiring Layer)

The first wiring layer 14 is formed by patterning with use of the self-alignment process. More specifically, as illustrated in FIG. 2A, the first wiring layer 14 that is made of the above-described material and has the above-described thickness may be first formed, for example, by sputtering on the entire surface of the gate insulation film 13.

Thereafter, as illustrated in FIG. 2B, a photoresist film 110A is formed in a selective region on the first wiring layer 14. The photoresist film 110A is formed in a region corresponding to the forming region of the source-drain wiring layer 16 (the forming region of the thin film transistor 10).

Thereafter, as illustrated in FIG. 2C, etching is performed with use of the photoresist film 110A as a mask to perform patterning of the first wiring layer 14. After the etching, the photoresist film 110A is removed from the first wiring layer 14.

Next, as illustrated in FIG. 3A, a photoresist film 110B is formed on the first wiring layer 14, and backside exposure is performed. In other words, the exposure is performed with use of the gate electrode 12 as a mask through the self-alignment process. More specifically, the exposure of the photoresist film 110B is performed by applying light L from lower side of the substrate 11. At this time, using a so-called negative photosensitive resin as the photoresist film 110B allows the gate electrode 12 (and the wiring layers 12a and 12b) to function as the mask as illustrated in FIG. 3B, and the photoresist film 110B remains in a region exposed from the gate electrode 12 and other layers.

Thereafter, as illustrated in FIG. 3C, etching of the first wiring layer 14 is performed with use of the photoresist film 110B as a mask. Subsequently, the photoresist film 110B is removed as illustrated in FIG. 3D, whereby the first wiring layer 14 is thus patterned and formed in the desired region. As a result, the first wiring layer 14 and the gate electrode 12 are so formed as not to be overlapped with each other in a plan view, and the end part of the first wiring layer 14 and the end part of the gate electrode 12 are disposed at the substantially same position. The first wiring layer 14 is thus formed with use of the self-alignment process.

(Formation of Second Wiring Layer)

Next, the second wiring layer 15 is formed. To start with, a contact hole H1 for interlayer connection is formed on the gate insulation film 13. More specifically, as illustrated in FIG. 4A, a photoresist film 110C is formed by patterning on the gate insulation film 13 and the first wiring layer 14, and etching of the gate insulation film 13 is performed with use of the photoresist film 110C as a mask. This allows for formation of the contact hole H1 on the desired region (for example, a region corresponding to the wiring layer 12a) of the gate insulation film 13. Thereafter, the photoresist film 110C is removed from the gate insulation film 13.

Subsequently, as illustrated in FIG. 4B, the second wiring layer 15 that is made of the above-described material and has the above-described thickness may be formed by, for example, a vacuum deposition method or sputtering on the gate insulation film 13. The second wiring layer 15 covers the first wiring layer 14, and embeds the contact hole H1.

Thereafter, as illustrated in FIG. 4C, a photoresist film 110D is formed by patterning, and etching of the second wiring layer 15 is performed with use of the photoresist film 110D as a mask. Note that the photoresist film 110D is so patterned as to be overlapped with a portion of the first wiring layer 14. The second wiring layer 15 is thus patterned and formed so as to be overlapped with the portion of the first wiring layer 14 through etching using the photoresist film 110D.

Thereafter, as illustrated in FIG. 4D, the photoresist film 110D is removed from the second wiring layer 15, thus forming the second wiring layer 15, namely, the source-drain wiring layer 16. Note that a portion of the first wiring layer 14 exposed from the second wiring layer 15 becomes a contact portion that comes into contact with the semiconductor layer 17a formed in the following process.

(Formation of Semiconductor Layer)

Next, the semiconductor layer 17a is formed. More specifically, as illustrated in FIG. 5A, the semiconductor layer 17a that is made of the above-described material (such as an oxide semiconductor) and has the above-described thickness may be formed by, for example, sputtering. At this time, the above-described semiconductor material is disconnected (divided) and deposited on the end part (the side surface) of the second wiring layer 15. In other words, the semiconductor layer 17a is formed to be in contact with the first wiring layer 14 in a region sandwiched between the second wiring layers 15. The semiconductor layer 17b is so formed on the second wiring layer 15 as to be separated from the semiconductor layer 17a. As mentioned above, in the present embodiment, a portion of the semiconductor layer 17a (for example, a shape in a gate length direction of the semiconductor layer 17a) is patterned by the second wiring layer 15. In addition, to ensure the disconnection, it is desirable that the thickness of the second wiring layer 15 be sufficiently larger than the thickness of the semiconductor layer 17a.

Thereafter, as illustrated in FIG. 5B and FIG. 6, a portion of the semiconductor layer 17a disposed on the gate insulation film 13 may be patterned by, for example, etching using a photolithography method. Note that FIG. 6 is a diagram illustrating a plan layout of a key part configuration illustrated in FIG. 5B. Here, since the first wiring layer 14 is configured of a transparent electroconductive film such as an oxide semiconductor, it may be difficult to secure etching selectivity with the semiconductor layer 17a (difficult to set a condition) and it is difficult to perform etching. In the present embodiment, however, the first wiring layer 14 is covered with the second wiring layer 15 and the semiconductor layer 17a. The etching of the semiconductor layer 17a is performed on the gate insulation film 13 and on the second wiring layer 15 that has the thickness sufficiently larger than the thickness of the semiconductor layer 17a. Accordingly, it is possible to form the semiconductor layer 17a in the desired region on the first wiring layer 14 with ease without undergoing an etching process that involves the difficult etching selectivity as described above. It is possible, in this way, to form the semiconductor layer 17a. In addition, as illustrated in FIG. 6, the first wiring layer 14 is adjacent to the gate electrode 12 at the position e1 and is wholly covered with the second wiring layer 15 and the semiconductor layer 17a, in a plan view. Further, the second wiring layer 15 is overlapped with the portion of the first wiring layer 14 and is not overlapped with the semiconductor layer 17a. The semiconductor layer 17b is formed on the second wiring layer 15. The thin film transistor 10 is completed in the manner described above.

Finally, as illustrated in FIG. 7, the interlayer insulation film 18 is formed and an annealing treatment is performed under oxygen ($O_2$) atmosphere. At this time, since the first wiring layer 14 is covered with the semiconductor layer 17a and the second wiring layer 15 as mentioned above, the first wiring layer 14 is not exposed to the oxygen atmosphere. This makes it possible to suppress the increase in resistance of the first wiring layer 14 serving as the contact part that comes into contact with the semiconductor layer 17a. In addition, although the annealing treatment may be performed in a process prior to the formation of the interlayer insulation film 18, the annealing treatment may be desirably performed after the completion of the thin film transistor 10. One reason is that this makes it possible to more stabilize the TFT characteristics.

[Workings and Effects]

In the thin film transistor 10 according to the present embodiment, a current across the source-drain wiring layer 16 (between the source and the drain) is controlled in accordance with the gate voltage applied to the gate electrode 12, whereby ON operation or OFF operation is performed. For example, when the gate voltage equal to or higher than a predetermined threshold voltage is applied to the gate electrode 12, an electric field is generated at the channel of the semiconductor layer 17a, and the current flows across the source-drain wiring layer 16, which results in the ON state. In various kinds of circuits in the display described later, the thin film transistor 10 may be used as, for example, a switching device or an amplification device.

Here, the thin film transistor 10 has the bottom-contact structure, allowing for utilization of the backside exposure (self-alignment process) with use of the gate electrode 12 as a mask, unlike the top-contact structure. This provides the following advantages.

FIG. 8 is a diagram illustrating an example of a configuration of a top-contact TFT as a comparative example (a comparative example 1) according to the present embodiment. FIG. 9 is a diagram illustrating a plan layout of a key part of FIG. 8. In the TFT of the comparative example 1, a semiconductor layer 107 is provided on a gate electrode 102 with a gate insulation film 103 in between. A source-drain wiring layer (a contact layer 108a and a wiring layer 108b) is so formed as to be in contact with a top surface of the semiconductor layer 107. An interlayer insulation film 109 is so formed as to cover the entire device.

In the structure of the comparative example 1, the contact layer 108a and the gate electrode 102 are so disposed as to be overlapped with each other (an overlap region $d_{OL}1$ is provided). This is because, for example, in the oxide TFT, a so-called lightly doped drain (LDD) process is not performed due to a lack of impurity dopant that is effective to the semiconductor layer 107. A parasitic capacitance, however, is easily increased due to the formation of the overlap region $d_{OL}1$. In addition, in the top-contact device structure, etching is performed on the semiconductor layer 107 in formation of the contact layer 108a (in formation of a contact hole), which may easily cause etching damage to a channel. Further, an overlap region $d_{OL}2$ is provided between the wiring layer 108b and the semiconductor layer 107 in consideration of lithography variation. Due to the overlap region $d_{OL}2$, electric stress is easily applied to the channel of the semiconductor layer 107. Furthermore, a channel length Lg is restricted in a short margin between the wiring layers 108b and in a positioning margin between the contact layer 108a and the wiring layer 108b. This makes it difficult to subminiaturize the channel length Lg.

In contrast, using the above-described backside exposure process by means of the self-alignment in the bottom-contact device structure as with the present embodiment makes it possible to minimize the above-described overlap region $d_{OL}1$. In other words, as illustrated in FIG. 1 and FIG. 6, the first wiring layer 14 serving as the contact layer is not overlapped with the gate electrode 12. More specifically, the end part of the first wiring layer 14 and the end part of the gate electrode 12 are disposed at the substantially same position e1. This makes it possible to reduce the parasitic capacitance. In addition, positional deviation and fluctuation are difficult to occur between the gate electrode 12 and the first wiring layer 14. This leads to a reduction in area of the retention capacitance and suppression of color unevenness caused by the variation of the retention capacitance attributed to the parasitic capacitance.

Further, since the first wiring layer 14 is formed prior to the semiconductor layer 17a owing to the bottom contact of the first wiring layer 14 to the semiconductor layer 17a, an etching process performed on the semiconductor layer 107 for the formation of the contact is unnecessary unlike the comparative example 1. Therefore, the etching damage to the semiconductor layer 17a does not occur, which makes it possible to reduce a decrease in reliability and variation in the TFT characteristics.

In addition, since the second wiring layer 15 is not overlapped with the semiconductor layer 17a, it is possible to reduce electric stress applied to the semiconductor layer 17a. This makes it possible to suppress a decrease in bias temperature instability (BTI) reliability and to minimize the parasitic capacitance.

Further, since the channel length is determined by the distance B between the first wiring layers 14, it is possible to subminiaturize the channel length.

FIG. 10A to FIG. 10E are diagrams illustrating an example of a process of manufacturing the bottom-contact TFT, as comparative example 2 according to the present embodiment. For example, as illustrated in FIG. 10A and FIG. 10B, the gate electrode 102, the gate insulation film 103, a contact layer 104 configured of a transparent electroconductive film, and a photoresist film 105 are formed on a substrate 101, following which the photoresist film 105 is patterned through the backside exposure. Subsequently, etching is performed with use of the photoresist film 105 as a mask as illustrated in FIG. 10C, following which the photoresist film 105 is removed as illustrated in FIG. 10D. Thereafter, as illustrated in FIG. 10E, a semiconductor layer 106 configured of, for example, an oxide semiconductor is formed on the contact layer 104 and is patterned. In the method of the comparative example 2, however, etching is performed on the contact layer 104 in the patterning of the semiconductor layer 106. It is not easy to perform etching having selectivity (secure selectivity) between the contact layer 104 (the transparent electroconductive film) and the semiconductor layer 106 (the oxide semiconductor), and it is extremely difficult to perform etching. In addition, the contact layer 104 has a resistance value higher than a resistance value of the metal, and is thus not suitable for wiring use. For example, a large current is necessary in a driver for an organic electroluminescence apparatus and thus the wiring use of the contact layer 104 is not realistic. In addition, an annealing treatment is performed after the channel formation in order to stabilize the characteristics of the TFT; however, the annealing treatment may easily increase the resistance value. In particular, the annealing treatment is performed under an oxygen atmosphere in the oxide TFT, which remarkably increases the resistance value of the transparent electroconductive film.

In contrast, in the present embodiment, the second wiring layer 15 is so provided as to be overlapped with the portion of the first wiring layer 14 (the bottom contact) in the source-drain wiring layer 16. This makes it possible to reduce resistance of the source-drain wiring layer 16 as compared with a case in which the source-drain wiring layer has a single layer structure of only the first wiring layer 14. In addition, in the manufacturing process, the semiconductor layer 17a is formed after the formation of the second wiring layer 15, and the semiconductor material is divided at the end part of the second wiring layer 15 (the semiconductor layers 17a and 17b are formed). This eliminates the necessity of etching of the semiconductor layer 17a on the first wiring layer 14. Accordingly, it is possible to form the semiconductor layer 17a in the desired region by patterning without performing difficult etching having selectivity between the first wiring layer 14 and the semiconductor layer 17a.

In addition, since the first wiring layer 14 is not exposed (is covered with the semiconductor layer 17a and the second wiring layer 15) in the annealing treatment performed after the channel formation, it is possible to suppress the increase in the resistance of the first wiring layer 14. Further, it is possible to perform the annealing treatment at the end of the manufacturing process (such as after the formation of the interlayer insulation film 18), which is advantageous in terms of stabilization of the TFT characteristics.

Moreover, the above-described effects such as the reduction in the resistance of the source-drain wiring layer 16, the reduction in the parasitic capacitance, the stabilization of the TFT characteristics, and the improvement in the reliability allow for high-speed operation of the thin film transistor 10. When such a thin film transistor 10 is applied to a display, it is possible to realize image display at high frame rate.

According to the foregoing present embodiment, the source-drain wiring layer 16 includes the first wiring layer 14 that is configured of the transparent electroconductive film and the second wiring layer 15 that is overlapped with the portion of the first wiring layer 14. The second wiring layer 15 is overlapped with the first wiring layer 14, which makes it possible to reduce the resistance of the source-drain wiring layer 16. In addition, in the manufacturing process, the semiconductor material is divided at the end part of the second wiring layer 15 by the formation of the semiconductor layer 17a after the formation of the second wiring layer 15. This makes it possible to form the semiconductor layer 17a in the desired region by patterning without performing etching having selectivity between the first wiring layer 14 and the semiconductor layer 17a. Accordingly, it is possible to make the manufacturing process easy and to achieve low voltage driving.

(Examples of Display)

The thin film transistor 10 as described above may be applied to, for example, the following displays (a liquid crystal display 1 and an organic electroluminescence apparatus 2). FIG. 11 is a diagram illustrating a schematic configuration of the liquid crystal display 1, and FIG. 12 is a diagram illustrating a schematic configuration of the organic electroluminescence apparatus 2.

As illustrated in FIG. 11, in the liquid crystal display 1, the above-described thin film transistor 10 is provided on the substrate 11, and a pixel electrode 19 is provided on the thin film transistor 10 with the interlayer insulation film 18 in between. The pixel electrode 19 may be provided, for example, for each pixel (each subpixel). A counter electrode 21 common to the pixels is provided to face the pixel electrodes 19, and a liquid crystal layer 20 is sealed between the pixel electrodes 19 and the counter electrode 21. Note that, although illustration is omitted, a counter substrate is provided on the counter electrode 21. A color filter, a black matrix, etc. are provided on the counter substrate. In addition, a polarization plate is bonded to a surface, on light incident side, of the substrate 11, and to a surface, on light exit side, of the counter substrate.

As illustrated in FIG. 12, in the organic electroluminescence apparatus 2, the above-described thin film transistor 10 is provided on the substrate 11, and a first electrode 22 is provided on the thin film transistor 10 with the interlayer insulation film 18 in between. The first electrode 22 may be provided, for example, for each pixel (each subpixel). A second electrode 24 common to the pixels is provided to face the first electrode 22, and an organic layer 23 including an organic electroluminescence layer is provided between the first electrode 22 and the second electrode 24. Note that, the first electrode 22, the organic layer 23, and the second electrode 24 are equivalent to an organic electroluminescence device 2A described later. In addition, although illustration is omitted, a sealing substrate is bonded to the second electrode 24 with a protection film and an adhesion layer in between. A color filter, a black matrix, etc. are provided on the sealing substrate as necessary.

FIG. 13 is a diagram illustrating a functional configuration of the above-described organic electroluminescence apparatus 2. In the organic electroluminescence apparatus 2, a plurality of pixels 140 each including the organic electroluminescence device 2A are arranged in a matrix in a display region 11A on the substrate 11. For example, each of the pixels 140 may emit any of light of red color (having a wavelength of 620 nm to 750 nm), light of green color (having a wavelength of 495 nm to 570 nm), and light of blue color (having a wavelength of 450 nm to 495 nm). Each of the pixels 140 is equivalent to a subpixel (an R pixel, a G pixel, or a B pixel), and image display is performed with use of a set of the R pixel, the G pixel, and the B pixel as one pixel. A signal line driving circuit 120 for image display and a scan line driving circuit 130 for image display are provided around the display region 11A.

As illustrated in FIG. 14, each of the pixels 140 includes a driving transistor Tr1 and a writing transistor Tr2, and a capacitor Cs is provided between the transistors Tr1 and Tr2. The organic electroluminescence device 2A is coupled in series to the transistor Tr1 between a first power supply line (Vcc) and a second power supply line (GND). The signal line driving circuit 120 supplies image signals to source electrodes of the respective transistors Tr2 through a plurality of signal lines 120A that are disposed in a column direction. The scan line driving circuit 130 sequentially supplies scan signals to gate electrodes of the respective transistors Tr2 through a plurality of scan lines 130A that are disposed in a row direction. The above-described thin film transistor 10 may be used for the transistors Tr1 and Tr2.

Application Examples

The display including the thin film transistor 10 described in the above-described embodiment is usable for electronic apparatuses in various field that displays an image signal inputted from outside or an image signal internally generated, as an image. Specific examples are described below. The above-described display, however, may be incorporated in electronic apparatuses such as a television, a digital camera, a video camera, a notebook personal computer, and a flexible display.

FIG. 15A and FIG. 15B are diagrams each illustrating an appearance of a smartphone 220. The smartphone 220 may include, for example, a display section 221 and an operation section 222 on front side, and a camera 223 on rear side. The display according to the above-described embodiment may be mounted on the display section 221.

FIG. 16 is a diagram illustrating an appearance of a tablet personal computer 240. The tablet personal computer 240 may include, for example, a touch panel section 241 and a housing 242, and the display according to the above-described embodiment may be mounted on the touch panel 241.

FIG. 17A and FIG. 17B are diagrams each illustrating an appearance of a mobile phone 290. The mobile phone 290 may be configured of, for example, an upper housing 291 and a lower housing 292 that are coupled to each other through a coupling part (a hinge part) 293. The mobile phone 290 may include, for example, a display 294, a sub-display 295, a picture light 296, and a camera 297. The display 294 or the sub-display 295 may be configured of the display according to the above-described embodiment.

FIG. 18 is a diagram illustrating an appearance of a transparent display 300. The transparent display 300 may include, for example, a display section 310, an operation section 311, and a housing 312. The display section 310 may be configured of the display according to the above-described embodiment. The transparent display 300 allows for display of an image and character information while making a background of the display section 310 transparent.

Hereinbefore, although the disclosure has been described with referring to the embodiment, the disclosure is not limited to the above-described embodiment, and various modifications may be made. For example, the materials and the thicknesses of the respective layers described in the above-described embodiment are not limited to those described above, and other materials or thicknesses may be adopted. In addition, it is unnecessary for the display to include all of the above-described layers, and the display may further include other layers in addition the above-described respective layers. Further, the effects described in the above-described embodiment are illustrative and non-limiting. Effects achieved by the disclosure may be effects other than those described above and may further include other effects.

The disclosure may have the following configurations as well.

(1)

A thin film transistor including:

a gate electrode;

an insulation film disposed on the gate electrode;

a semiconductor layer facing the gate electrode with the insulation film in between; and a source-drain wiring layer electrically coupled to the semiconductor layer, and including a first wiring layer and a second wiring layer, the first wiring layer being in contact with the semiconductor layer between the semiconductor layer and the insulation film and being configured of a transparent electroconductive film, the second wiring layer being overlapped with a portion of the first wiring layer, another semiconductor layer made of a material same as a material of the semiconductor layer being stacked on the second wiring layer.

(2)

The thin film transistor according to (1), wherein the first wiring layer is non-overlapped with an end part of the gate electrode in a plan view.

(3)

The thin film transistor according to (2), wherein the first wiring layer includes an end part that is disposed at a substantially same position as the end part of the gate electrode in the plan view.

(4)

The thin film transistor according to any one of (1) to (3), wherein the second wiring layer is made of a metal.

(5)

The thin film transistor according to any one of (1) to (4), wherein the second wiring layer has a thickness larger than a thickness of the semiconductor layer.

(6)

The thin film transistor according to any one of (1) to (5), wherein the second wiring layer is non-overlapped with the semiconductor layer.

(7)

The thin film transistor according to any one of (1) to (6), wherein the first wiring layer is covered with the semiconductor layer and the second wiring layer.

(8)

The thin film transistor according to any one of (1) to (7), wherein the semiconductor layer is configured of an oxide semiconductor.

(9)

The thin film transistor according to any one of (1) to (8), wherein the semiconductor layer is configured of an organic semiconductor.

(10)

A method of manufacturing a thin film transistor, the method including:

forming a gate electrode;
forming an insulation film on the gate electrode;
forming a semiconductor layer that faces the gate electrode with the insulation film in between;
forming a source-drain wiring layer that is electrically coupled to the semiconductor layer, wherein a first wiring layer and a second wiring layer are formed in this order as the source-drain wiring layer, the first wiring layer being made of a transparent electroconductive film, the second wiring layer being overlapped with a portion of the first wiring layer; and
forming the semiconductor layer after the forming of the second wiring layer.

(11)

The method of manufacturing the thin film transistor according to (10), wherein the first wiring layer is formed through photolithography, the photolithography including an exposure process that uses the gate electrode as a mask.

(12)

The method of manufacturing the thin film transistor according to (10) or (11), wherein the second wiring layer is made of a metal.

(13)

The method of manufacturing the thin film transistor according to any one of (10) to (12), wherein a thickness of the second wiring layer is made larger than a thickness of the semiconductor layer.

(14)

The method of manufacturing the thin film transistor according to any one of (10) to (13), wherein the first wiring layer is covered with the semiconductor layer and the second wiring layer.

(15)

The method of manufacturing the thin film transistor according to any one of (10) to (14), wherein the semiconductor layer is configured of an oxide semiconductor.

(16)

The method of manufacturing the thin film transistor according to any one of (10) to (14), wherein the semiconductor layer is configured of an organic semiconductor.

(17)

A display provided with a thin film transistor, the thin film transistor including:
a gate electrode;
an insulation film disposed on the gate electrode;
a semiconductor layer facing the gate electrode with the insulation film in between; and
a source-drain wiring layer electrically coupled to the semiconductor layer, and including a first wiring layer and a second wiring layer, the first wiring layer being in contact with the semiconductor layer between the semiconductor layer and the insulation film and being configured of a transparent electroconductive film, the second wiring layer being overlapped with a portion of the first wiring layer,
another semiconductor layer made of a material same as a material of the semiconductor layer being stacked on the second wiring layer.

This application is based upon and claims the benefit of priority of the Japanese Patent Application No. 2014-204636 filed with the Japan Patent Office on Oct. 3, 2014, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A thin film transistor, comprising:
a gate electrode;
an insulation film on the gate electrode;
a first semiconductor layer, wherein the insulation film is between the gate electrode and the first semiconductor layer;
a source-drain wiring layer electrically coupled to the first semiconductor layer, wherein
the source-drain wiring layer includes a first layer and a second layer,
the first layer of the source-drain wiring layer is between the first semiconductor layer and the insulation film,
the first layer of the source-drain wiring layer comprises a transparent electroconductive film,
a portion of the first layer of the source-drain wiring layer is covered by the first semiconductor layer, and
a remaining portion of the first layer other than the portion covered by the first semiconductor layer is covered by the second layer of the source-drain wiring layer, such that two surfaces of the first layer are in contact with the second layer of the source-drain wiring layer; and
a second semiconductor layer that comprises a first material, wherein
a first surface of the second layer of the source-drain wiring layer is in contact with the second semiconductor layer,
a second surface of the second layer of the source-drain wiring layer is in contact with the insulation film,
the first surface is opposite to the second surface,
the first material is same as a second material of the first semiconductor layer,
the second semiconductor layer is on the second layer of the source-drain wiring layer, and
the second layer of the source-drain wiring layer separates the first semiconductor layer and the second semiconductor layer.

2. The thin film transistor according to claim 1, wherein the first layer of the source-drain wiring layer is non-overlapped with a first end part of the gate electrode in a plan view.

3. The thin film transistor according to claim 2, wherein, in the plan view, a position of an end part of the first layer is same as a position of a second end part of the gate electrode.

4. The thin film transistor according to claim 1, wherein the second layer of the source-drain wiring layer comprises a metal.

5. The thin film transistor according to claim 1, wherein a thickness of the second layer of the source-drain wiring layer is larger than a thickness of the first semiconductor layer.

6. The thin film transistor according to claim 1, wherein the second layer of the source-drain wiring layer is non-overlapped with the first semiconductor layer.

7. The thin film transistor according to claim 1, wherein the first semiconductor layer comprises an oxide semiconductor.

8. The thin film transistor according to claim 1, wherein the first semiconductor layer comprises an organic semiconductor.

9. A display, comprising:
a thin film transistor that comprises:
a gate electrode;
an insulation film on the gate electrode;

a first semiconductor layer, wherein the insulation film is between the gate electrode and the first semiconductor layer;
a source-drain wiring layer electrically coupled to the first semiconductor layer, wherein
the source-drain wiring layer includes a first layer and a second layer,
the first layer of the source-drain wiring layer is between the first semiconductor layer and the insulation film,
the first layer of the source-drain wiring layer comprises a transparent electroconductive film,
a portion of the first layer of the source-drain wiring layer is covered by the first semiconductor layer, and
a remaining portion of the first layer other than the portion covered by the first semiconductor layer is covered by the second layer of the source-drain wiring layer, such that two surfaces of the first layer are in contact with the second layer of the source-drain wiring layer; and
a second semiconductor layer that comprises a first material, wherein
a first surface of the second layer of the source-drain wiring layer is in contact with the second semiconductor layer,
a second surface of the second layer of the source-drain wiring layer is in contact with the insulation film,
the first surface is opposite to the second surface,
the first material is same as a second material of the first semiconductor layer,
the second semiconductor layer is on the second layer of the source-drain wiring layer, and
the second layer of the source-drain wiring layer separates the first semiconductor layer and the second semiconductor layer.

* * * * *